United States Patent
Verspecht et al.

(10) Patent No.: US 10,735,036 B1
(45) Date of Patent: Aug. 4, 2020

(54) METHOD FOR MEASURING FREQUENCY OFFSET BETWEEN AN RF TRANSMITTER AND A TEST RECEIVER

(71) Applicant: Keysight Technologies, Inc., Santa Rosa, CA (US)

(72) Inventors: Jan Verspecht, Santa Rosa, CA (US); Troels Studsgaard Nielsen, Aalborg (DK)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/552,596

(22) Filed: Aug. 27, 2019

(51) Int. Cl.
  *H04B 1/04* (2006.01)
  *H04B 1/16* (2006.01)
  *H04B 17/21* (2015.01)
  *H04L 27/26* (2006.01)
  *H03D 7/14* (2006.01)
  *H03L 7/00* (2006.01)
  *H04B 17/00* (2015.01)
  *H04L 27/28* (2006.01)

(52) U.S. Cl.
  CPC ......... *H04B 1/0475* (2013.01); *H03D 7/1466* (2013.01); *H03L 7/00* (2013.01); *H04B 1/16* (2013.01); *H04B 17/0085* (2013.01); *H04B 17/21* (2015.01); *H04L 27/265* (2013.01)

(58) Field of Classification Search
  CPC .. H04B 1/0475; H04B 17/21; H04B 17/0085; H04B 1/16; H03D 7/1466; H03L 7/00; H04L 27/265
  USPC ........................................................ 375/326
  See application file for complete search history.

(56) References Cited

U.S. PATENT DOCUMENTS

| | | | |
|---|---|---|---|
| 7,868,607 B2 | 1/2011 | Dunsmore | |
| 8,983,796 B2 | 3/2015 | Bednorz | |
| 9,350,470 B1 | 5/2016 | Anderson | |
| 9,793,857 B1 | 10/2017 | Anderson | |
| 2008/0232496 A1* | 9/2008 | Lin | H04L 27/2663 375/260 |

(Continued)

OTHER PUBLICATIONS

Zhiying, Study on the test method for a frequency converter with an embedded local oscillator in satellite, 2015 IEEE 12th International Conference on Electronic Measurement & Instruments, ICEMI'2015, pp. 979-982.

(Continued)

*Primary Examiner* — Lee Nguyen

(57) ABSTRACT

A method for operating a data processing system to determine the actual frequency of a transmitter LO in a transmitter that up converts a repetitive input time domain signal to a repetitive RF signal is disclosed. The method includes receiving a repetitive RF signal resulting from up converting the input time domain signal and assuming a value for the transmitter LO frequency. The received signal is down converted to an IF signal using the transmitter LO frequency, and digitizes to form a time domain record, The time domain record is converted to a sequence of frequency spectra, each frequency spectrum is characterized by a time index and a plurality of plurality of phasors. The frequency difference between the assumed LO transmitter and an actual LO transmitter frequency is determined by fitting the sequence of frequency spectra to a phase tracker function of the time index and the frequency difference.

20 Claims, 1 Drawing Sheet

(56) References Cited

U.S. PATENT DOCUMENTS

2018/0054269 A1* 2/2018 Cui .................... H04L 27/2676

OTHER PUBLICATIONS

Keysight Technologies, Inc., Measuring Group Delay of Frequency Converters with Embedded Local Oscillators, Dec. 2, 2017, USA.

* cited by examiner

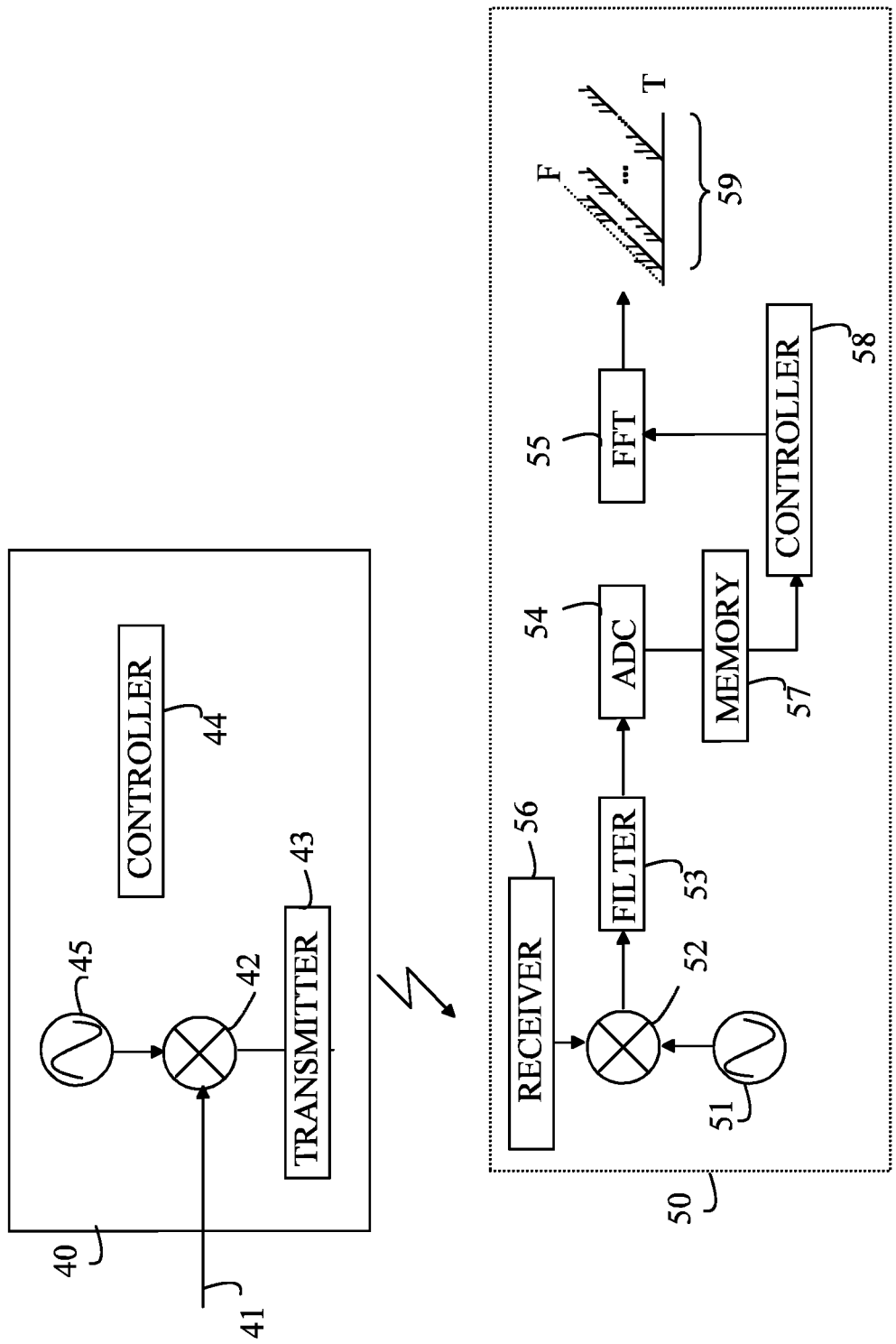

METHOD FOR MEASURING FREQUENCY OFFSET BETWEEN AN RF TRANSMITTER AND A TEST RECEIVER

BACKGROUND

High-frequency components or systems are often characterized by using a stimulus signal that is a periodically modulated radio-frequency (RF) carrier and by measuring and analyzing the response signal. In virtually all applications, the response of the device-under-test (DUT) will also be a periodically modulated RF carrier. Because both response and stimulus signals are periodically modulated, they can be represented by a set of complex Fourier series coefficients, also called "plurality of phasors", that are associated with a discrete set of frequencies. This set of frequencies is represented by a uniform frequency grid centered around the carrier frequency. This grid will be referred to in the following paragraphs as the frequency grid. The amplitudes and phases of the complex plurality of phasors are typically measured by a receiver that is based on a local oscillator (LO), a frequency converting mixer, a filter, an analog-to-digital convertor (ADC) and a digital signal processor. The DUT is characterized by comparing the plurality of phasors of the response to those of the stimulus signal.

If the stimulus signal generator is synchronized with the receiver, the DUT response signal will also be synchronized with the receiver and a straight digital Fourier transform (DFT) can be used to retrieve the plurality of phasors. However, there are a number of applications in which the stimulus signal generator and the receiver cannot be synchronized. For example, a DUT includes a LO used in a frequency converter, and the LO is not accessible to the signal generator which presents challenges in terms of synchronization. In that case, calculating the exact measurement receiver LO frequencies such that the intermediate frequency (IF) signal frequencies generated in the receiver are aligned with the exact DFT frequencies in the stimulus signal presents significant challenges. Because of the misalignment of IF frequencies and DFT frequencies, applying a DFT on the response signal results in inaccurate values for the plurality of phasors and coherent averaging will not result in an improved signal-to-noise ratio (SNR), but will further distort the phasor values.

One method for addressing this problem is based on a network analyzer that first detects the frequency offset between the LO of the instrument receiver and the LO of the DUT by injecting a pilot tone and by measuring its phase as a function of time. Once this frequency offset has been determined, the instrument receiver is tuned to the LO frequency of the DUT and experiments are performed by injecting one tone at a time into the DUT, stepping the tone frequency, and by comparing the phasor of the stimulus signal with the phasor of the response signal.

There are important applications in which the DUT with an embedded LO system must be characterized using a realistic stimulus signal having in excess of one thousand tones. For example, the test goal is to characterize the nonlinear distortion of the system. A method based on using one or two tones cannot provide the desired characterization. In addition, interrupting the realistic stimulus signal to inject a single calibration tone is not attractive because the DUT may change temperature during the calibration process. In principle, one of the tones in the stimulus signal could be used to measure the frequency offset; however, since the overall power of the signal is spread out across many tones, each of the tones does not have enough SNR to be used as a quality pilot tone by itself.

SUMMARY

The present invention includes a method for operating a data processing system to determine the actual frequency of a transmitter LO in a transmitter that up converts a repetitive input time domain signal to a repetitive RF signal, and a computer readable medium that includes instructions that cause a receiver having a LO to execute that method. The method includes receiving a repetitive RF signal resulting from up converting the input time domain signal, the repetitive RF signal is characterized by a plurality of RF tones and assuming a value for the transmitter LO frequency. The method also includes (1) down converting the repetitive RF signal to an IF signal using the assumed value for the transmitter LO frequency, (2) digitizing the IF signal to form a time domain record, (3) converting the time domain record to a sequence of frequency spectra, each frequency spectrum is characterized by a time index indicating a location of samples in the time domain record used to construct that frequency spectrum and a plurality of plurality of phasors, and (4) determining a frequency difference between the assumed LO transmitter and an actual LO transmitter frequency by fitting the sequence of frequency spectra to a phase tracker function of the time index and the frequency difference.

In one aspect, the method also includes determining a measure of phase noise introduced by the transmitter into the repetitive RF signal by fitting the sequence of frequency spectra to a phase tracker function of the time index and the frequency difference.

In one aspect, the method also includes repeating steps (1)-(4) after correcting the assumed transmitter LO frequency for the determined frequency difference.

In one aspect, the phase tracker function includes a first function of three or more of the plurality of plurality of phasors, the phase tracker function having a phase that is a function of the frequency difference and the time index.

In one aspect, the first function includes a cross correlation of the plurality of phasors at a first time index and the plurality of phasors at a second time index.

In one aspect, down converting the repetitive RF signal to an IF signal includes mixing the repetitive RF signal with an analyzer LO signal characterized by an analyzer LO frequency and the plurality of plurality of phasors all have frequencies greater than the analyzer LO frequency.

In one aspect, down converting the repetitive RF signal to an IF signal includes mixing the RF signal with an analyzer LO signal characterized by an analyzer LO frequency and the plurality of plurality of phasors all have frequencies less than the analyzer LO frequency.

In one aspect, down converting the repetitive RF signal to an IF signal includes mixing the RF signal with an analyzer LO signal characterized by an analyzer LO frequency and the phase tracker function includes a second function of three or more of the plurality of plurality of phasors, the plurality of phasors of the first function all having frequencies greater than the analyzer LO frequency and the plurality of phasors of the second function all having frequencies less than the analyzer LO frequency, each of the first and second functions having a phase that is a function of the frequency difference and the time index.

In one aspect, the first function includes a weighted average of the three or more of the plurality of plurality of phasors.

In one aspect, the IF signal is characterized by an IF signal bandwidth, the repetitive RF signal has a bandwidth that is greater than the IF signal bandwidth, the IF signal is characterized by an IF power, and the IF signal is chosen based on the IF power.

In one aspect, each of the frequency spectra is generated by a DFT of a corresponding block of the time domain samples, the corresponding block having sufficient samples to isolate each tone in the IF signal into a different DFT tone.

BRIEF DESCRIPTION OF THE DRAWINGS

FIG. 1 illustrates a satellite transmitter 40 and a test instrument 50 that analyzes the time domain transmitted signal.

DETAILED DESCRIPTION

The manner in which the present invention provides its advantages can be more easily understood with reference to the testing of a transmitter having a LO that is used for up converting a time domain signal and broadcasting the up converted signal. Refer now to FIG. 1, which illustrates a satellite transmitter 40 and a test instrument 50 that analyzes the time domain transmitted signal. It is assumed that a repetitive time domain signal is input on port 41 of satellite transmitter 40. This signal is up converted using a LO 45 and a mixture 42, which are under the control of the controller 44. The up converted signal is transmitted by transmitter 43. It is to be understood that satellite transmitter 40 may include many additional tones and may process the up converted signal prior to transmission. However, these functions are not central to the present invention, and hence, will not be discussed in detail here.

Test instrument 50 is typically a vector network analyzer (VNA). Test instrument 50 includes a receiver 56 that receives the RF signal from satellite transmitter 40 and converts that signal to a time domain signal that is applied to a mixer 52 which down converts the signal to an intermediate band determined by LO 51. The output of mixer 52 is typically filtered through a filter 53 which blocks unwanted mixing products. The output of filter 53 is digitized by ADC 54. The digitized output is stored in memory 57. The number of samples digitized is sufficient to provide the input for a number of different frequency spectra starting at different times during the ADC record using a fast Fourier transform (FFT) 55. The manner in which this number of samples is chosen will be discussed in more detail below. For the moment, it is sufficient to note that each FFT spectrum is characterized by a time index of the first sample that is included in the time domain record that is transformed. Each spectrum comprises a number of plurality of phasors, each phasor providing an amplitude and phase of a corresponding tone. A controller 58 constructed the sequence of spectra shown at 59.

Assume the frequency of LO 51 is slightly different from that of LO 45. Denote the difference by an offset frequency, $f_u$. In principle, the frequency offset can be determined by examining the phases of the tones in the FFT spectra as a function of the time index associated with each FFT spectrum. Since each FFT spectrum is computed from a single continuous ADC record, the phase of a tone corresponding to one of the tones in the input signal to test instrument 50 will vary linearly with the time index, the slope of that line being proportional to $f_u$.

However, as noted above, the signals of interest involve thousands of tones, and hence, the power in any one tone is very small. Accordingly, such a determination of the phase slope is likely to be corrupted by noise.

The present invention mitigates this problem by constructing a "phase tracker" from three or more tones and having an amplitude that has sufficient power to overcome the noise problems and whose phase is a function of the first time index in the ADC record used to construct that FFT spectrum and $f_u$. Denote the phase tracker by P(d, fu, a), where a is a vector of constant parameters. The parameters $f_u$ and a can be fitted to a number of observed P values for different values of d, and hence, the value of $f_u$ can be determined. The number of d values used and the number of tones in P reduce noise errors.

The method of the present invention starts by determining the number of ADC samples that are to be transformed to a frequency spectrum by the FFT. The frequency resolution of the FFT is determined by the number of samples that are transformed, more samples corresponding to finer frequency resolutions. The preferred frequency resolution is set such that the FFT separates all of the plurality of phasors in the IF signal generated by mixer 52. It should be noted that the plurality of phasors that are present in the IF signal may include direct mixing products between the RF plurality of phasors and the receiver LO signal as well as image mixing products and harmonic mixing products. The minimum number of ADC samples needed to provide this resolution will be denoted by R.

In one aspect of the invention, the number of ADC samples used to generate each frequency spectrum is preferably R. If less than R samples are used, the frequency spectrums have insufficient resolution. If more than R samples are used, the computational workload is increased without providing a significant additional benefit in terms of reducing the effects of noise.

Denote the sample index of the first sample of a block of R ADC samples by d. Denote the set of FFT spectra generated by transforming the R ADC samples starting at d by S(d,k), where k is the index of the $k^{th}$ tone in that spectrum. Here S is a complex value. In principle, a new spectrum could be computed for each block of R samples, i.e., for d values of 1, 2, .... As will be explained in more detail below, for d values of less than R, the resulting spectra will exhibit correlations in the noise values between successive spectra. The manner in which these correlations can be mitigated will be discussed in more detail below.

The frequency of LO 51 and R are chosen such that the down converted plurality of phasors will be on the exact DFT frequencies when $f_u=0$. Since the input signal to the satellite transmitter is periodic, the output of the satellite transmitter will be a set of discrete tones around the modulation frequency. It is assumed that the modulation frequency is $f_{RF}+f_u$ with a tone spacing of $f_M$ between the tones. The number of tones in the IF signal generated by the VNA may be significantly less than the number of tones in the RF signal. The frequency of LO 51 is set such that the IF signal in the VNA contains tones having a significant fraction of the power in the modulated signal. Denote the number of tones in this set by 2K+1. This RF signal is to be down converted in the test instrument using a LO having frequency $f_{LO}$.

For example, for modern wireless telecommunications standards like 5G, the tones of the RF signal are spread across a modulation bandwidth of 800 MHz. Although less common, the power spectral density across the bandwidth can vary significantly. A typical VNA has an IF bandwidth equal to about 40 MHz. That is, the LO frequency can be tuned such that the resulting IF signal captures at least $\frac{1}{20}^{th}$ of the total signal power. For practical applications this provides enough SNR to calculate a good phase tracker function using the present invention.

There is still some freedom in setting the LO frequency in the test instrument. In one aspect of the invention, the LO frequency is set such that all of the tones in the IF signal arising from the tones in the modulated RF signal are at positive frequencies. This ensures that interference between the positive and negative tones is suppressed. Since determining $f_u$ depends on the use of a DFT, it is important that $f_M$ is compatible with the frequency grid of the DFT. Hence, $$f_M = Mf_0 = Mf_s/R.$$

where M is an integer, $f_0$ is the DFT frequency resolution, $f_s$ is the ADC sampling rate, and R is the DFT record size. The LO frequency, $f_{LO}$, and the record size are chosen such that the down converted plurality of phasors end up on exact DFT frequencies when $f_u=0$. In one aspect, this is accomplished by choosing $f_{LO}=f_{RF}-Kf_M-Df_0$, where D is an integer.

In one exemplary embodiment, the phase tracker is constructed from the cross-correlation of the spectrum at time index 0 and a spectrum at time index d. This function has a phase that is linear in d and a slope of $2\pi\epsilon/R$, where $\epsilon=f_u/f_s$. Hence, fitting this model function as a function of d using several spectra allows one to determine the value of $f_u$, and hence, the offset between the assumed transmitter frequency and the actual transmitter frequency. Given this difference, the LO in the test instrument can be adjusted such that the frequency grid of the test instrument matches that of the tones in the input signal to the transmitter.

Furthermore, this cross-correlation function has a magnitude that is approximately that of the combined power of all the measured plurality of phasors, and hence, is resistant of noise contamination even when the test signal has thousands of tones. While the above-described embodiment uses the cross-correlation of the spectrum at d=0 and that at each of a plurality of spectra starting at different d values, the phase tracker could use the spectrum at any fixed d value in place of the spectrum at d=0.

In principle, a spectrum S(d,k) can be computed for each value of d. However, if this is done, the noise in the successive spectra will be correlated and many more spectra will be needed to provide the desired noise averaging. In one aspect, S(d,k) is computed for d values that are integer multiples of R, i.e., S(nR,k). In this case, the noise on successive spectra will not be correlated. If d is different from nR, $$P(d)=P(0)\exp(2\pi j\epsilon d/R)E(\epsilon,d).$$

Here, $E(\epsilon,d)$ is a function that arises from the fact that the DFT is not exactly an orthogonal transformation if the frequencies of the digitized signal are not precisely aligned with the DFT bins. This results in two problems. First, there will be a small bias on the extracted value of the phasor, and second, the extracted value of each phasor will have a small contribution from all of the other plurality of phasors. This latter problem is often referred to as spectral leakage.

The function, $E(\epsilon,d)$ is 1 for $f_u=0$ and decreases slowly in a second order manner as $|f_u|$ increases. In one aspect of the invention, E is determined by assuming $E(c,d)=1$. This provides an approximation for $f_u$. The LO frequency of the VNA is then changed to reflect this approximation for $f_u$, and the process is repeated to arrive at a new approximation for $f_u$. When $f_u$ no longer decreases or a fixed number of iterations have occurred, the iterations are terminated and the LO frequency is then assumed to be synchronized with the LO in the transmitter.

As noted above, a new spectrum can, in principle, be generated for each value of d. However, the correlation of the noise in the different spectra poses challenges. The use of a windowing function can reduce these problems and also reduce spectral leakage. In this case, $$S(d, D + kM) = \frac{1}{R}\sum_{i=0}^{R-1} W(i)x_{IF}(i+d)\exp\left(-2\pi j\frac{D+kM}{R}i\right)$$

where W(i) are the weights of the windowing function and $x_{IF}(i+d)$ is the time series value from the ADC for time point i+d. This is equivalent to multiplying the time series with a weight before applying the DFT algorithm.

The above-described embodiments generate for frequencies that are above the frequency of the LO in the VNA sufficiently to ensure that all of the negative frequencies in the IF as well as the positive frequencies are greater than the LO frequency. Embodiments in which all of the tones in the spectra are at frequencies less than the frequency of the LO can also be constructed and lead to an analogous phase tracker function.

As noted above, the bandwidth needed to analyze all of the tones in the input to the VNA may be significantly greater than the bandwidth of the available IF signal in the VNA with all of the tones in the VNA spectra being either above or below the LO frequency of the VNA. In some cases, there is sufficient bandwidth to accommodate all of the required tones if the spectra are split into a spectrum at positive frequencies relative to the LO in the VNA and a spectrum at negative frequencies relative to the LO.

In one exemplary embodiment, the phase tracker comprises a first cross-correlation of the plurality of phasors in the negative frequency range added to a cross correlation of the plurality of phasors in the positive frequency range. Each cross correlation comprises a correlation between two spectra at different d values in a manner analogous to that discussed above.

In some cases, there will be insufficient bandwidth in the VNA to analyze all of the tones in the RF signal even using the above-described embodiments. In one exemplary embodiment, the subset of the tones is chosen. Preferably, the group of tones having the highest combined power is utilized; however, any block of tones having a significant fraction of the power could be utilized. Once the offset is determined, the RF signal can be analyzed one block at a time using the correct LO signal in the VNA.

The above-described embodiments make no assumptions about the relative amplitudes of the tones in the time-varying spectra. It is assumed that no tone has sufficient power to have a SNR that would allow that tone to be a pilot tone that can be used to determine the offset discussed above. If in a particular case, it turns out that one or more of the tones has sufficient power to be more reliable than other tones, the cross-correlation function can be weighted to favor the more reliable tones.

The above-described embodiments utilize a phase tracker function that comprises a cross-correlation function; however, other phase tracker functions can be utilized. In one exemplary embodiment, a phase tracker function comprises fitting a function that comprises the phase difference between the corresponding tones in the respective time dependent Fourier transforms. In one example, an average phase deviation per Fourier transform is computed and fitted to a linear function of d.

In the above-described embodiments, the phase tracker function is used to determine the offset between the transmitter LO and the LO in the receiver in the VNA or similar measurement instrument. The phase tracker can also be used to estimate the phase noise in the transmitter. This aspect of the invention is based on the assumption that the phase noise of the receiver LO is small compared to the phase noise of the transmitter. Hence, the random fluctuations of the phases observed by the phase tracker from the fitting of the phase tracker function to the sequence of spectra as a function of d is an estimate of the phase noise introduced by the transmitter. For example, the variance in the phase about the average determined to find the offset frequency is a measure of this noise.

While prior art methods using a pilot tone are known for measuring the phase noise of the transmitter, these methods have significant challenges when the measurement must be performed while applying a realistically modulated signal to the transmitter.

The present invention also includes a computer readable memory that stores instructions that cause a receiver having a receiver LO to determine the internal LO frequency of a transmitter that modulated a repetitive time-domain signal using a transmitter LO. For the purposes of this disclosure, a computer readable medium is any medium that constitutes patentable subject matter under 35 U.S.C. 101, and excludes any medium that is not patentable subject matter under 35 U.S.C. 101. Examples of such media are non-transitive storage media such as disk drives or non-volatile memories.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A method for determining the actual frequency of a transmitter LO in a transmitter that up converts a repetitive input time domain signal to a modulated RF signal characterized by a transmitter LO frequency, said method comprising:
   receiving a repetitive RF signal resulting from up converting said repetitive input time domain signal in a receiver, said repetitive RF signal being characterized by a plurality of RF tones;
   assuming a value for said transmitter LO frequency;
   (1) down converting said repetitive RF signal in said receiver to an IF signal using said assumed value for said transmitter LO frequency;
   (2) digitizing said IF signal to form a time domain record comprising a sequence of time domain samples;
   (3) converting said time domain record to a sequence of frequency spectra, each frequency spectrum being characterized by a time index indicating a location of samples in said time domain record used to construct that frequency spectrum and a plurality of plurality of phasors; and
   (4) determining a frequency difference between said assumed value and an actual LO transmitter frequency by fitting said sequence of frequency spectra to a phase tracker function of said time index and said frequency difference.

2. The method of claim 1 further comprising determining a measure of phase noise introduced by said transmitter into said repetitive RF signal by fitting said sequence of frequency spectra to a phase tracker function of said time index and said frequency difference.

3. The method of claim 1 further comprising repeating steps (1)-(4) after correcting said assumed value for said determined frequency difference.

4. The method of claim 1 wherein said phase tracker function comprises a first function of three or more of said plurality of plurality of phasors, said phase tracker function having a phase that is a function of said frequency difference and said time index.

5. The method of claim 4 wherein said first function comprises a cross correlation of said plurality of plurality of phasors at a first time index and said plurality of plurality of phasors at a second time index.

6. The method of claim 4 wherein said first function comprises a weighted average of said three or more of said plurality of plurality of phasors.

7. The method of claim 1 wherein down converting said repetitive RF signal to an IF signal comprises mixing said repetitive RF signal with an analyzer LO signal characterized by an analyzer LO frequency and said plurality of plurality of phasors all have frequencies greater than said analyzer LO frequency.

8. The method of claim 1 wherein down converting said repetitive RF signal to an IF signal comprises mixing said repetitive RF signal with an analyzer LO signal characterized by an analyzer LO frequency and said plurality of plurality of phasors all have frequencies less than said analyzer LO frequency.

9. The method of claim 1 wherein down converting said repetitive RF signal to an IF signal comprises mixing said repetitive RF signal with an analyzer LO signal characterized by an analyzer LO frequency and said phase tracker function comprises a second function of three or more of said plurality of plurality of phasors, said plurality of phasors of said first function all having frequencies greater than said analyzer LO frequency and said plurality of phasors of said second function all having frequencies less than said analyzer LO frequency, each of said first and second functions having a phase that is a function of said frequency difference and said time index.

10. The method of claim 1 wherein said IF signal is characterized by an IF signal bandwidth, said repetitive RF signal has a bandwidth that is greater than said IF signal bandwidth, said IF signal being characterized by an IF power, and said IF signal being chosen based on said IF power.

11. The method of claim 1 wherein each of said frequency spectra in said sequence of frequency spectra is generated by a DFT of a corresponding block of said sequence of time domain samples, said corresponding block having sufficient samples to isolate each tone in said IF signal into a different DFT tone.

12. A computer readable medium that stores instructions that cause a receiver having a receiver LO to determine an internal LO frequency of a transmitter that modulated a repetitive input time-domain signal using a transmitter LO characterized by a transmitter LO frequency and a method comprising:

receiving a repetitive RF signal resulting from up converting said repetitive input time domain signal, said repetitive RF signal being characterized by a plurality of RF tones;

assuming a value for said transmitter LO frequency;

(1) down converting said repetitive RF signal to an IF signal using said assumed value for said transmitter LO frequency;

(2) digitizing said IF signal to form a time domain record comprising a sequence of time domain samples;

(3) converting said time domain record to a sequence of frequency spectra, each frequency spectrum being characterized by a time index indicating a location of samples in said time domain record used to construct that frequency spectrum and a plurality of plurality of phasors; and (4) determining a frequency difference between said assumed value and an actual LO transmitter frequency by fitting said sequence of frequency spectra to a phase tracker function of said time index and said frequency difference.

13. The computer readable medium of claim 12 further comprising instructions for determining a measure of phase noise introduced by said transmitter into said repetitive RF signal by fitting said sequence of frequency spectra to a phase tracker function of said time index and said frequency difference.

14. The computer readable medium of claim 12 wherein said method further comprises repeating steps (1)-(4) after correcting said assumed value for said determined frequency difference.

15. The computer readable medium of claim 12 wherein said phase tracker function comprises a first function of three or more of said plurality of plurality of phasors, said phase tracker function having a phase that is a function of said frequency difference and said time index.

16. The computer readable medium of claim 12 wherein down converting said repetitive RF signal to an IF signal comprises mixing said repetitive RF signal with an analyzer LO signal characterized by an analyzer LO frequency and said plurality of plurality of phasors all have frequencies greater than said analyzer LO frequency.

17. The computer readable medium of claim 12 wherein down converting said repetitive RF signal to an IF signal comprises mixing said repetitive RF signal with an analyzer LO signal characterized by an analyzer LO frequency and said plurality of plurality of phasors all have frequencies less than said analyzer LO frequency.

18. The computer readable medium of claim 12 wherein down converting said repetitive RF signal to an IF signal comprises mixing said repetitive RF signal with an analyzer LO signal characterized by an analyzer LO frequency and said phase tracker function comprises a second function of three or more of said plurality of plurality of phasors, said plurality of phasors of said first function all having frequencies greater than said analyzer LO frequency and said plurality of phasors of said second function all having frequencies less than said analyzer LO frequency, each of said first and second functions having a phase that is a function of said frequency difference and said time index.

19. The computer readable medium of claim 12 wherein said IF signal is characterized by an IF signal bandwidth, said repetitive RF signal has a bandwidth that is greater than said IF signal bandwidth, said IF signal being characterized by an IF power, and said IF signal being chosen based on said IF power.

20. The computer readable medium of claim 12 wherein each of said frequency spectra in said sequence of frequency spectra is generated by a DFT of a corresponding block of said sequence of time domain samples, said corresponding block having sufficient samples to isolate each tone in said IF signal into a different DFT tone.

* * * * *